(12) United States Patent
Oyama et al.

(10) Patent No.: US 8,960,442 B2
(45) Date of Patent: Feb. 24, 2015

(54) WAFER STORING CONTAINER

(75) Inventors: Takaharu Oyama, Tokyo (JP); Chiaki Matsutori, Tokyo (JP); Tsuyoshi Nagashima, Tokyo (JP); Shuichi Inoue, Tokyo (JP); Hiroyuki Shida, Saitama (JP); Hiroki Yamagishi, Saitama (JP); Kazumasa Onuki, Saitama (JP)

(73) Assignees: Miraial Co., Ltd., Tokyo (JP); Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 14/356,852

(22) PCT Filed: Nov. 8, 2011

(86) PCT No.: PCT/JP2011/075656
§ 371 (c)(1),
(2), (4) Date: May 7, 2014

(87) PCT Pub. No.: WO2013/069088
PCT Pub. Date: May 16, 2013

(65) Prior Publication Data
US 2014/0367307 A1    Dec. 18, 2014

(51) Int. Cl.
*B65D 85/48* (2006.01)
*H01L 21/673* (2006.01)

(52) U.S. Cl.
CPC .... *H01L 21/67383* (2013.01); *H01L 21/67386* (2013.01); *Y10S 206/832* (2013.01)
USPC .......................................... 206/711; 206/832

(58) Field of Classification Search
USPC .......................... 206/710, 711, 454, 449, 832; 211/41.14, 41.18; 414/938, 941
See application file for complete search history.

(56) References Cited

U.S. PATENT DOCUMENTS 5,507,873 A    4/1996 Ishizuka et al.
5,706,946 A    1/1998 Kakizaki et al.
(Continued)

FOREIGN PATENT DOCUMENTS

JP    06-168903    6/1994
JP    H09-064162    3/1997
(Continued)

OTHER PUBLICATIONS

Japan Patent Office, International Search Report for PCT Application No. PCT/JP2011/075656, mail date Jan. 24, 2012.
(Continued)

*Primary Examiner* — Jacob K Ackun
(74) *Attorney, Agent, or Firm* — SoCal IP Law Group LLP; Steven C. Sereboff; John E. Gunther

(57) ABSTRACT

Wafer support shelves (10, 10) are each provided with wafer support projections (A, B1, B2) on which parts of the outer margins of a semiconductor wafer (W) are to be placed. In each case, one of the support projections (A, B1, B2) is provided on the far side of the center position of the semiconductor wafer (W), and two of the support projections are provided on the near side of the center of the semiconductor wafer. By means of this structure, in a state in which a lid body (3) is not attached to a wafer extraction/insertion opening (2), the flexure amount of the semiconductor wafers placed on the support projections of multiple locations in the wafer support shelves can be reduced with a minimal number of projections, so that a hindrance is not created to an operation such as extraction by a robot arm.

4 Claims, 11 Drawing Sheets

(56) References Cited

U.S. PATENT DOCUMENTS

| | | | |
|---|---|---|---|
| 5,725,101 | A | 3/1998 | Kakizaki et al. |
| 5,782,361 | A | 7/1998 | Kakizaki et al. |
| 5,788,082 | A | 8/1998 | Nyseth |
| 7,073,999 | B2 * | 7/2006 | Oyama .................. 414/217 |
| 2006/0272975 | A1 | 12/2006 | Matsutori et al. |
| 2006/0283774 | A1 | 12/2006 | Hasegawa et al. |
| 2009/0162183 | A1 * | 6/2009 | Davison ............... 414/798.9 |
| 2010/0307957 | A1 * | 12/2010 | Wiseman .................. 206/711 |
| 2013/0056388 | A1 * | 3/2013 | Nagashima ............... 206/711 |
| 2013/0299384 | A1 * | 11/2013 | Fuller ..................... 206/711 |

FOREIGN PATENT DOCUMENTS

| JP | H09-162134 | 6/1997 |
|---|---|---|
| JP | H11-135606 | 5/1999 |
| JP | 2004-214269 | 7/2004 |
| JP | 2006-319012 | 11/2006 |
| JP | 2006-324327 | 11/2006 |
| JP | 2011-060877 | 3/2011 |
| JP | 2011-108715 | 6/2011 |
| JP | 3171789 U | 10/2011 |
| JP | 2011-253960 | 12/2011 |

OTHER PUBLICATIONS

The International Bureau, Notification of the Recording of a Change for PCT Application No. PCT/JP2011/075656, mail date Apr. 19, 2013.

The International Bureau, Notification of the Recording of a Change for PCT Application No. PCT/JP2011/075656, mail date Jun. 14, 2012.

The International Bureau, Notification of the Recording of a Change for PCT Application No. PCT/JP2011/075656, mail date Apr. 12, 2012.

IPEA/Japan, International Preliminary Report on Patentability PCT Application No. PCT/JP2011/075656, mail date Oct. 1, 2013.

* cited by examiner

WAFER STORING CONTAINER

This application is a National Stage of Patent Cooperation Treaty Application No. PCT/JP2011/075656, filed Nov. 8, 2011, the content of which is incorporated herein by reference.

TECHNICAL FIELD

The present invention relates to a wafer storing container for storing semiconductor wafers when keeping or transporting the semiconductor wafers.

BACKGROUND ART

A wafer storing container is generally provided with a container body for storing a plurality of semiconductor wafers in a state of being arranged in a parallel manner. A wafer load/unload opening for loading or unloading the semiconductor wafers is formed in a front face of the container body of such a wafer storing container. A cover for closing the wafer load/unload opening is provided so as to be removably attached from a front of the wafer load/unload opening.

In order to retain the semiconductor wafers in an unshaken state inside the container body, a back-side retainer is arranged at the back inside the container body as viewed from the wafer load/unload opening, and a cover-side retainer is provided to an inner wall of the cover. The cover-side retainer and the back-side retainer elastically retain outer margins in the vicinities of front-side and back-side ends of the semiconductor wafers.

However, the cover-side retainer does not retain the semiconductor wafers, unless the cover is attached to the wafer load/unload opening of the container body. The back-side retainer can retain only the back side of the semiconductor wafers inside the container body.

Accordingly, wafer support shelves for secondarily mounting the side edges of the semiconductor wafers inside the container body are provided on the right and left sides inside the container body as viewed from the wafer load/unload opening, so as to horizontally support each of the semiconductor wafers until the cover is attached to the container body. When retained by the back-side retainer and the cover-side retainer, the semiconductor wafers are uplifted and separated from the wafer support shelves (for example, Patent Document 1).

When supported by the wafer support shelves, the semiconductor wafers should not be mounted on the entire surface of the wafer support shelves. This is because, when the outer margins of the semiconductor wafers are mounted on the entire range of the arcuate wafer support shelves, particles (scraped particles) are likely to be generated due to friction between the semiconductor wafers and microscopic irregularity on the wafer support shelves, and posture of each of the semiconductor wafers may vary due to profile irregularity (flatness) of the shelves.

Accordingly, it has been proposed that semiconductor wafers are made in point contact or line contact with wafer support shelves (for example, Patent Document 2); or it has been proposed that a semiconductor wafer is horizontally supported at four points in total of wafer support shelves on the right and left sides, by providing four wafer support projections to the wafer support shelves (at one point each on the back and front sides in each of the right and left sides, on the basis of the central position of the semiconductor wafer as viewed from the wafer load/unload opening), the wafer support projections partially mounting an outer margin of the semiconductor wafer (for example, Patent Document 3).

PRIOR ART DOCUMENT

Patent Document

Patent Document 1: Japanese Unexamined Patent Application, Publication No. 2004-214269
Patent Document 2: Japanese Unexamined Patent Application, Publication No. H9-64162
Patent Document 3: U.S. Patent No. 5788082 (Japanese Unexamined Patent Application, Publication No. H10-70185)

DISCLOSURE OF THE INVENTION

Problems to be Solved by the Invention

FIG. 9 shows an example of a state where a semiconductor wafer W is supported at four points of wafer support shelves 10, 10 in a container body 1 of the conventional wafer storing container as described above. DO denotes a reference center line (a lateral center line on a plane of the semiconductor wafer W), which passes through a central position of the semiconductor wafer W, and is parallel to a wafer load/unload opening 2. BP denotes a longitudinal center line orthogonal to the reference center line DO, on the plane of the semiconductor wafer W.

As schematically shown in FIG. 10, a back-side wafer support projection A is provided on the back side on the basis of the central position of the semiconductor wafer W, and is provided in a direction at an angle of, for example, 45 degrees relative to the reference center line DO; and a front-side wafer support projection B is provided on the front side on the basis of the central position of the semiconductor wafer W, and is provided in a direction at an angle of, for example, 20 degrees relative to the reference center line DO.

FIG. 11 shows measurement data (measured values) of the amount of deflection at each position of the semiconductor wafer W, in a case in which the semiconductor wafer W having a diameter of 450 mm is supported on such wafer support shelves 10, 10. The amount of deflection is significantly greater than that of a widely-used conventional semiconductor wafer W with a diameter of 300 mm. The amount of deflection increases when the semiconductor wafer W with the diameter of 300 mm is formed more thinly than the standard thickness.

If the amount of deflection of the semiconductor wafer W in a supported state is increased, inconvenience arises, for example, in which a robot arm for unloading each slice of the semiconductor wafers W from the container body cannot be skillfully inserted into the clearance between the adjacent semiconductor wafers W. Meanwhile, such inconvenience also arises if the outer circumference of the semiconductor wafer W is mounted on the entire surface of the wafer support shelves 10 so as to avoid deflection of the semiconductor wafer W.

An object of the present invention is to provide a wafer storing container, which is capable of suppressing the amount of deflection of semiconductor wafers mounted on a plurality of support projections of wafer support shelves, in a state where a cover is not attached to a wafer load/unload opening of a container body, while minimizing the number of the support projections, such that no problems occur in the unloading or the like with a robot arm.

Means for Solving the Problems

In order to achieve the above mentioned object, the wafer storing container of the present invention includes: a container body for storing a plurality of semiconductor wafers in a state of being arranged in a parallel manner; a wafer load/unload opening that is formed in a front face of the container body for the purpose of loading or unloading the semiconductor wafer to or from the container body; a cover removably attached from a front of the wafer load/unload opening for the purpose of closing the wafer load/unload opening; and wafer support shelves for individually mounting outer margins of the plurality of semiconductor wafers so as to horizontally support the semiconductor wafers at positions on right and left sides inside the container body as viewed from the wafer load/unload opening, in a state where the cover is not attached to the wafer load/unload opening. The outer margins of the plurality of semiconductor wafers are partially mounted on wafer support projections of the wafer support shelves arranged on the right and left sides as viewed from the wafer load/unload opening. The wafer support projections are provided at one point on a back side and at two points on a front side in each of the right and left sides, on the basis of a central position of the semiconductor wafers as viewed from the wafer load/unload opening.

Among the front-side wafer support projections provided at two points in each of the right and left sides, second front-side wafer support projections farther from a reference center line may be each provided in a direction at an angle within a range of 45±15 degrees relative to the reference center line, which passes through the central position of the semiconductor wafers, and is parallel to the wafer load/unload opening.

Among the front-side wafer support projections provided at two points in each of the right and left sides on the front side on the basis of the central position of the semiconductor wafers, first front-side wafer support projections closer to the reference center line may be each provided in a direction at an angle within a range of 20±5 degrees relative to the reference center line. The first and second front-side wafer support projections may have a relative positional relationship with each other at different angles within a range of 10 to 30 degrees around the central position of the semiconductor wafers.

In this case, in a state where the semiconductor wafers are supported by the wafer support shelves, the semiconductor wafers may be in a state of concurrently being in contact with and being mounted on the first and second front-side wafer support projections. The second front-side wafer support projections may be provided in a position lower than a position of the first front-side wafer support projections, within a range of 0.2 mm. The back-side wafer support projections provided at one point in each of the right and left sides may be provided at a position lower than any of the front-side wafer support projections provided at two points in each of the right and left sides.

Effects of the Invention

According to the present invention, the outer margins of the plurality of semiconductor wafers are partially mounted on wafer support projections of the wafer support shelves arranged on the right and left sides as viewed from the wafer load/unload opening; and the wafer support projections are provided at one point on a back side and at two points on a front side in each of the right and left sides, on the basis of a central position of the semiconductor wafers as viewed from the wafer load/unload opening. As a result, in the state where the cover is not attached to the wafer load/unload opening of the container body, the amount of deflection of the semiconductor wafers mounted on the plurality of support projections of the wafer support shelves can be suppressed while minimizing the number of the support projections, such that no problems occur in the unloading or the like by a robot arm.

EXPLANATION OF REFERENCE NUMERALS

Figure 1:
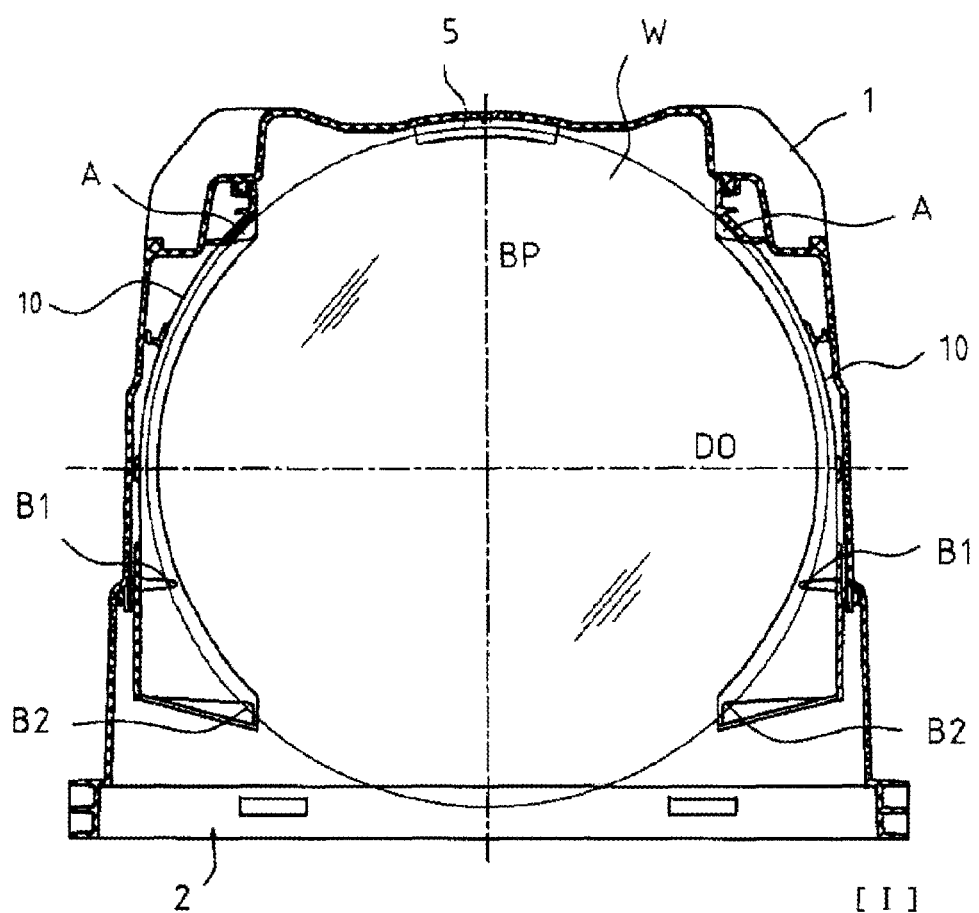
FIG. 1 is a plane cross-sectional view of a wafer storing container according to a first embodiment of the present invention, in a state where a cover is not attached thereto.

1: container body
2: wafer load/unload opening
3: cover

5: back-side retainer
6: cover-side retainer
10: wafer support shelf
A: back-side wafer support projection
B1, B2: front-side wafer support projection
W: semiconductor wafer

PREFERRED MODE FOR CARRYING OUT THE INVENTION

Figure 2:
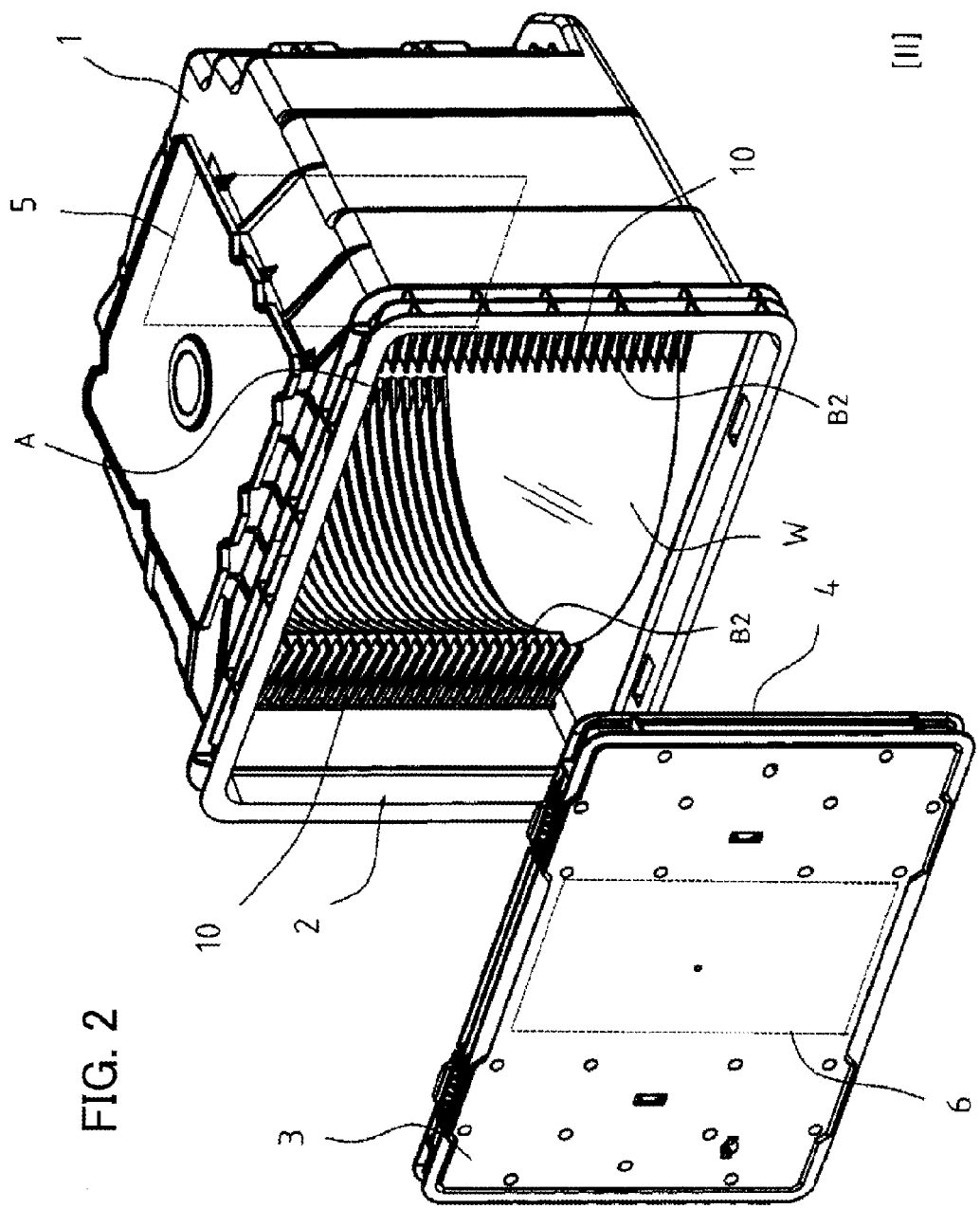
FIG. 2 is a perspective view of an overall configuration of the wafer storing container according to the first embodiment of the present invention.

Embodiments of the present invention are hereinafter described with reference to the drawings. FIG. 2 is a perspective view of a wafer storing container according to a first embodiment of the present invention. FIG. 1 is a plane cross-sectional view of the wafer storing container viewed from the top, in a state where a cover is not attached thereto.

Reference numeral 1 denotes a container body for storing a plurality of semiconductor wafers W shaped like a thin disk in a state of being arranged in a parallel manner. The container body 1 is formed of, for example, a plastic material such as polybutylene terephthalate (PBT) or polycarbonate (PC).

As shown in FIG. 2, when each of the semiconductor wafers W is loaded into or unloaded from the container body 1, the container body 1 is arranged to horizontally store each of the semiconductor wafers W. The semiconductor wafers W have a diameter of, for example, 450 mm.

A multitude of (for example, 25 slices of) semiconductor wafers W are stored in the container body 1 at an equal interval, in a state where the surfaces thereof face each other with a clearance in between. However, FIG. 2 shows a state where only a single slice of semiconductor wafer W is stored at a bottom position inside the container body 1.

A wafer load/unload opening 2 for loading or unloading the semiconductor wafers W is formed in a front face of the container body 1. In this manner, in the present specification, among each face of the container body 1, a face forming the wafer load/unload opening 2 is referred to as the "front face".

A cover 3 for closing the wafer load/unload opening 2 is provided so as to be attachable and removable from the front of the wafer load/unload opening 2. The cover 3 is not illustrated in FIG. 1.

Reference numeral 4 shown in FIG. 2 denotes a resilient sealing member that is attached to the cover 3 for the purpose of sealing a gap between outer edge portions of the cover 3 and the wafer load/unload opening 2. The cover 3 is provided with a well-known locking mechanism or the like for the purpose of locking a state where the cover 3 is attached to the wafer load/unload opening 2 (descriptions thereof are omitted herein).

As shown in FIGS. 1 and 2, a back-side retainer 5 is arranged at the back inside the container body 1 as viewed from the wafer load/unload opening 2. The back-side retainer 5 individually positions and retains outer margins of the plurality of semiconductor wafers W inside the container body 1. The back-side retainer 5 may be a well-known retainer. For example, a portion of the back-side retainer 5 for retaining each of the semiconductor wafers W is formed in the shape of a horizontal V-groove.

Meanwhile, as schematically shown in FIG. 2, a well-known cover-side retainer 6 is provided on an inner wall of the cover 3. The cover-side retainer 6 individually and elastically pushes the outer margins of the plurality of semiconductor wafers W from the wafer load/unload opening 2 side toward the back-side retainer 5 side, thereby positioning and retaining the semiconductor wafers W.

The cover-side retainer 6 includes a configuration, for example, in which the V-grooved portion abutting on the outer circumference of each of the semiconductor wafers W is supported by a support member having spring properties to be easily and elastically transformed when the cover 3 is attached to the wafer load/unload opening 2 of the container body 1. Since this configuration is well-known, detailed illustrations thereof are omitted herein.

Wafer support shelves 10, 10 are provided on right and left sides inside the container body 1 as viewed from the wafer load/unload opening 2. In the state where the cover 3 is not attached to the wafer load/unload opening 2, the wafer support shelves 10, 10 individually support the outer margins of the plurality of semiconductor wafers W in the horizontal state. The number of steps of the wafer support shelves 10, 10, which are provided at an equal interval on the right and left sides, coincides with the number of the semiconductor wafers W stored in the container body 1; and the number is 25 or the like, for example.

In the state where the cover 3 is not attached to the wafer load/unload opening 2, each of the semiconductor wafers W is in a state of being supported by the wafer support shelves 10, 10 on the right and left sides inside the container body 1, thereby being retained in a substantially horizontal state.

The wafer support shelves 10, 10 and the back-side retainer 5 are formed integrally with the container body in the present embodiment, which may however be configured such that one or both thereof is/are formed as a component(s) separate from the container body, and is/are attached to the container body. The back-side retainer 5 may be formed in the back most portion of the wafer support shelves 10, 10.

Figure 3:
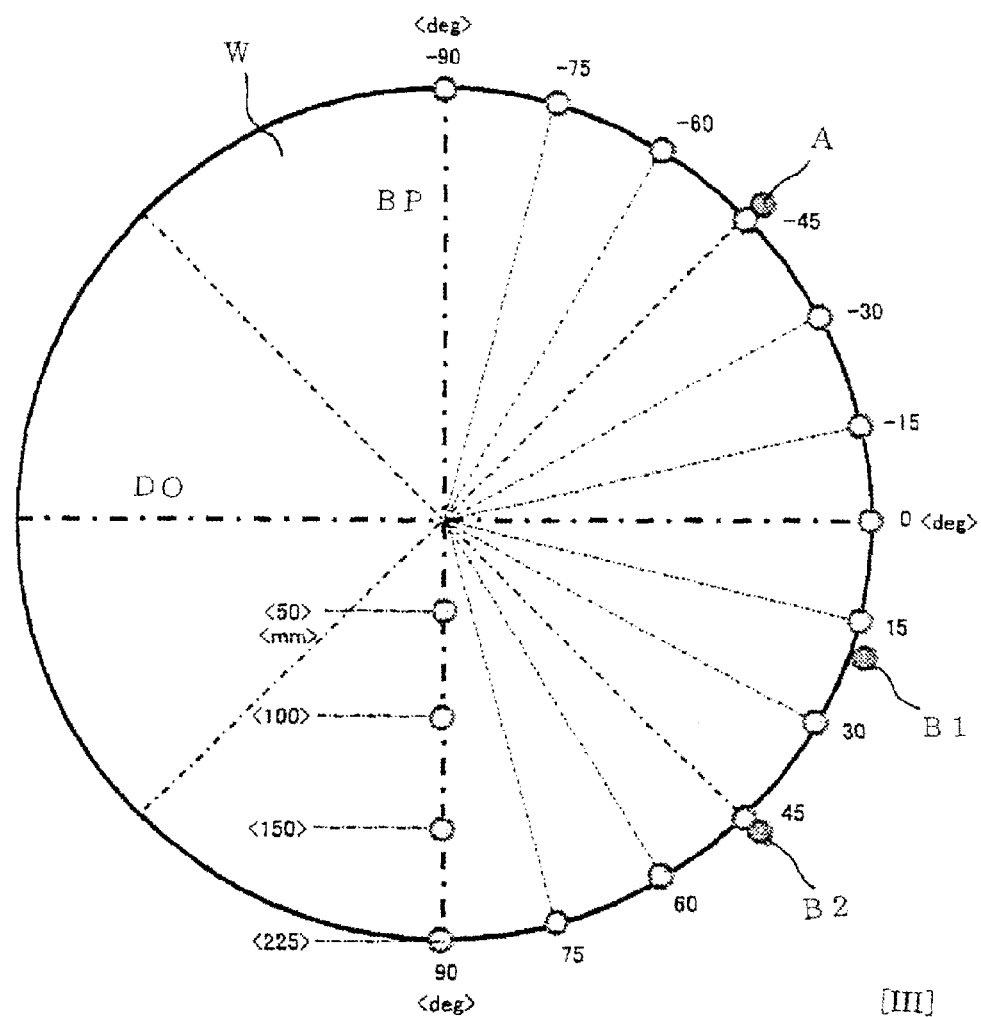
FIG. 3 is a schematic diagram showing points for mounting the semiconductor wafer, and points for measuring the amount of deflection thereof, in a state where the cover is not attached to the wafer storing container according to the first embodiment of the present invention, and where the semiconductor wafer is mounted on the wafer support shelves.

Wafer support projections A, B1, B2 are provided to each of the wafer support shelves 10, 10 that are arranged on the right and left sides as viewed from the wafer load/unload opening 2. Positions for providing the wafer support projections A, B1, B2 are at one point on the back side, and at two points on the front side, on the basis of the central position of the semiconductor wafers W, as viewed from the wafer load/unload opening 2. As FIG. 3 schematically shows the positional relationship between the wafer support projections A, B1, B2 and the semiconductor wafer W, the outer margin of the semiconductor wafer W is partially mounted on the wafer support projections A, B1, B2, in the state where the cover 3 is not attached to the wafer load/unload opening 2.

Each of the wafer support projections A, B1, B2 has a small face formed at a position slightly higher than the other regions of the wafer support shelves 10, 10, on which the wafer support projections A, B1, B2 are formed.

Figure 4:
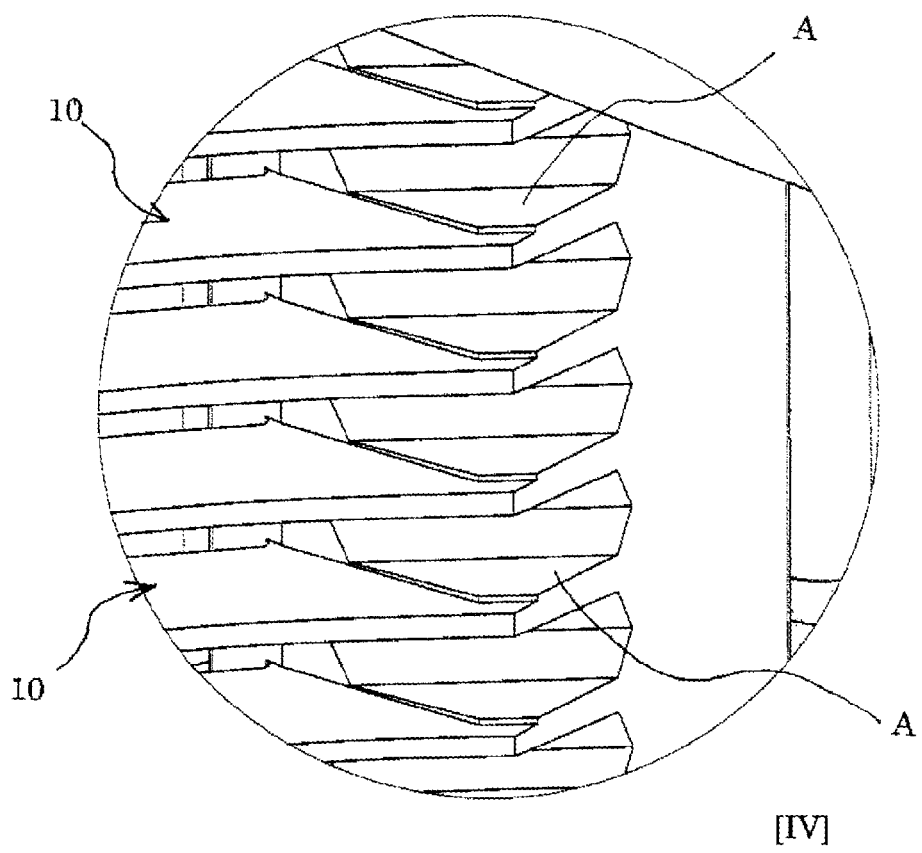
FIG. 4 is a partially enlarged perspective view showing by partially enlarging the wafer support projections formed in the wafer support shelves of the wafer storing container according to the first embodiment of the present invention.

An area of each of the wafer support projections A, B1, B2 is not as narrow as a perfect dot. However, as FIG. 4 shows an example of the back-side wafer support projections A in an enlarged manner, the area thereof is extremely smaller than the total area of the wafer support shelves 10, 10.

By using a robot arm or the like (not illustrated), the semiconductor wafer W is inserted through the wafer load/unload opening 2 into the container body, and enters the container body 1 along the wafer support shelves 10, 10. When the robot arm is retracted, the semiconductor wafer W is supported in a state of being mounted on six points of the wafer support projections A, B1, B2. The semiconductor wafers W are supported by the wafer support shelves 10, 10 in this manner, and are therefore in contact with the wafer support shelves 10, 10 at only the wafer support projections A, B1, B2.

As schematically shown in FIG. 3, the back-side wafer support projections A are provided at one point in each of the right and left of the back side on the basis of the central position of the semiconductor wafer W, and are each provided in a direction at an angle within a range of 45 (approximately ±5) degrees relative to a reference center line DO, which passes through the central position of the semiconductor wafer W, and is parallel to the wafer load/unload opening 2.

Among the front-side wafer support projections B1, B2 provided at two points in each of the right and left sides on the front side on the basis of the central position of the semiconductor wafer W, the first front-side wafer support projections B1 closer to the reference center line DO are each provided in a direction at an angle within a range of 20 (approximately ±5) degrees relative to the reference center line DO.

Among the front-side wafer support projections B1, B2 provided at two points in each of the right and left sides, the second front-side wafer support projections B2 farther from the reference center line DO are each provided in a direction at an angle within a range of 45 (approximately ±15) degrees relative to the reference center line DO.

Figure 5:
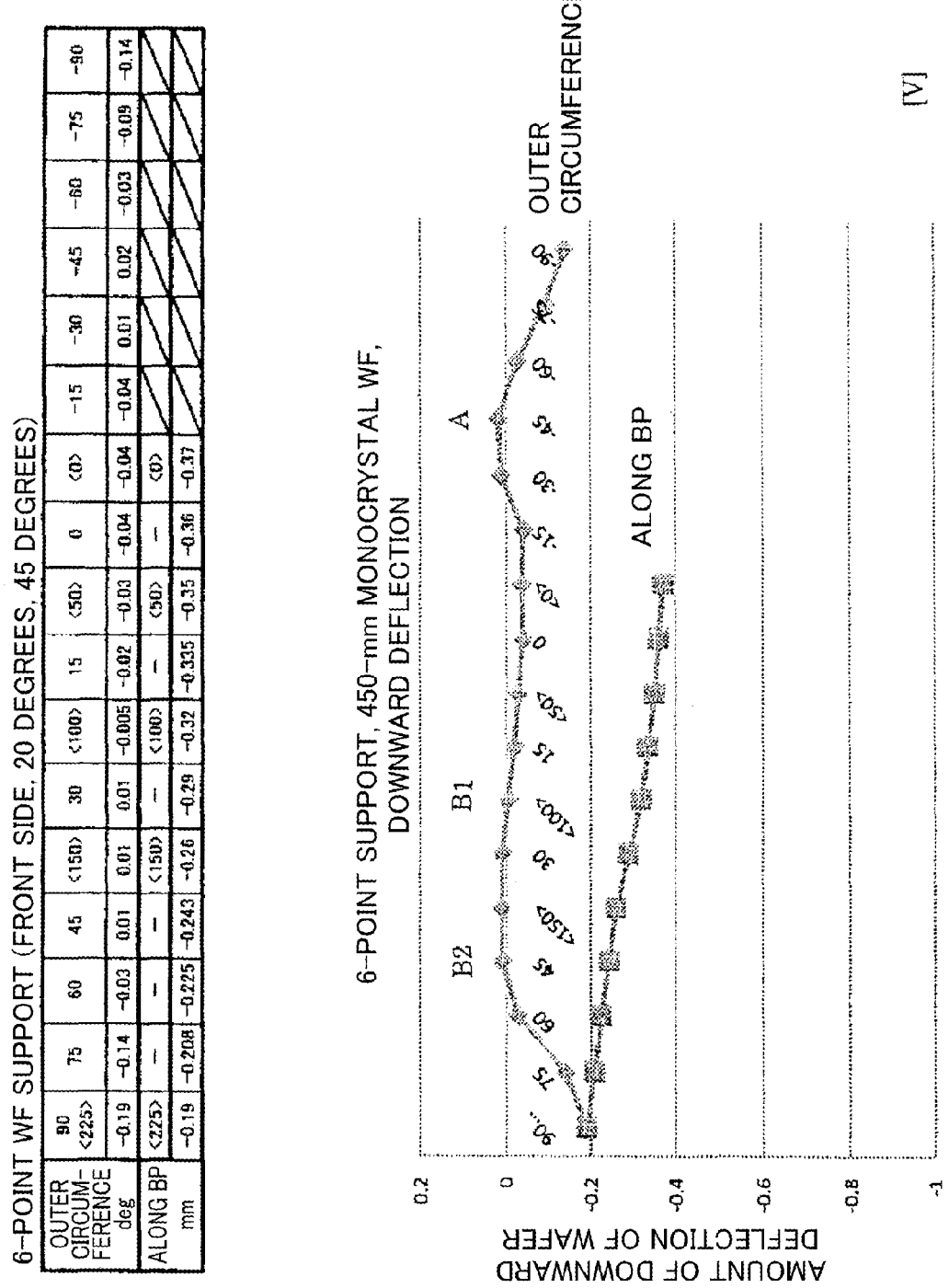
FIG. 5 shows a table and graph for illustrating measurement data (measured values) of the amount of deflection at each position of the semiconductor wafer, when the cover is not attached to the wafer storing container according to the first embodiment of the present invention, and when the semiconductor wafer is mounted on the wafer support shelves.
Figure 11:
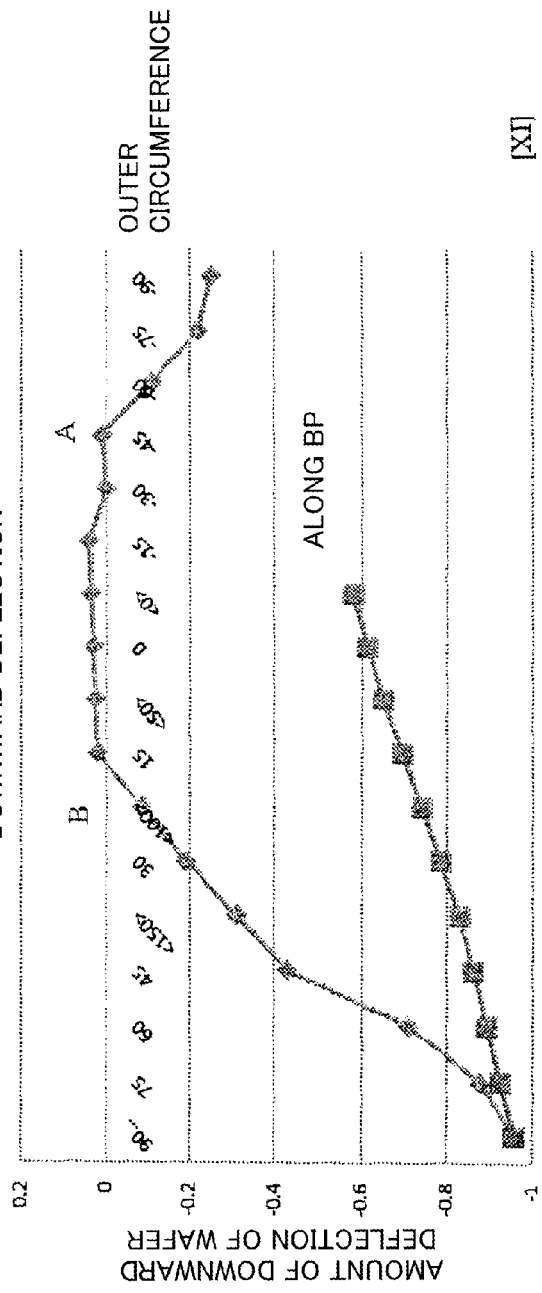
FIG. 11 shows a table and graph for illustrating measurement data (measured values) of the amount of deflection at each position of the semiconductor wafer, in a case in which the semiconductor wafer is supported on conventional wafer support shelves.

FIG. 5 shows a table and graph for illustrating measurement data (measured values) of the amount of deflection at each position of the semiconductor wafer W, in a case in which the semiconductor wafer W is mounted on the wafer support shelves 10, 10 of the wafer storing container 1 according to the first embodiment configured as described above. As compared with the conventional wafer storing container shown in FIG. 11, the amount of deflection of the semiconductor wafer W is drastically reduced not only on the outer margin but also along a longitudinal center line BP of the semiconductor wafer W.

As a result, in the state where the cover 3 is not attached to the wafer load/unload opening 2, the semiconductor wafers W having a diameter of 450 mm can be unloaded with a robot arm or the like without any trouble. The present invention can restrict the number of the support projections A, B1, B2 to a requisite minimum, can prevent particles from being generated, can prevent the posture of the semiconductor wafers W from varying, and can suppress the amount of deflection of the semiconductor wafers W.

Figure 6:
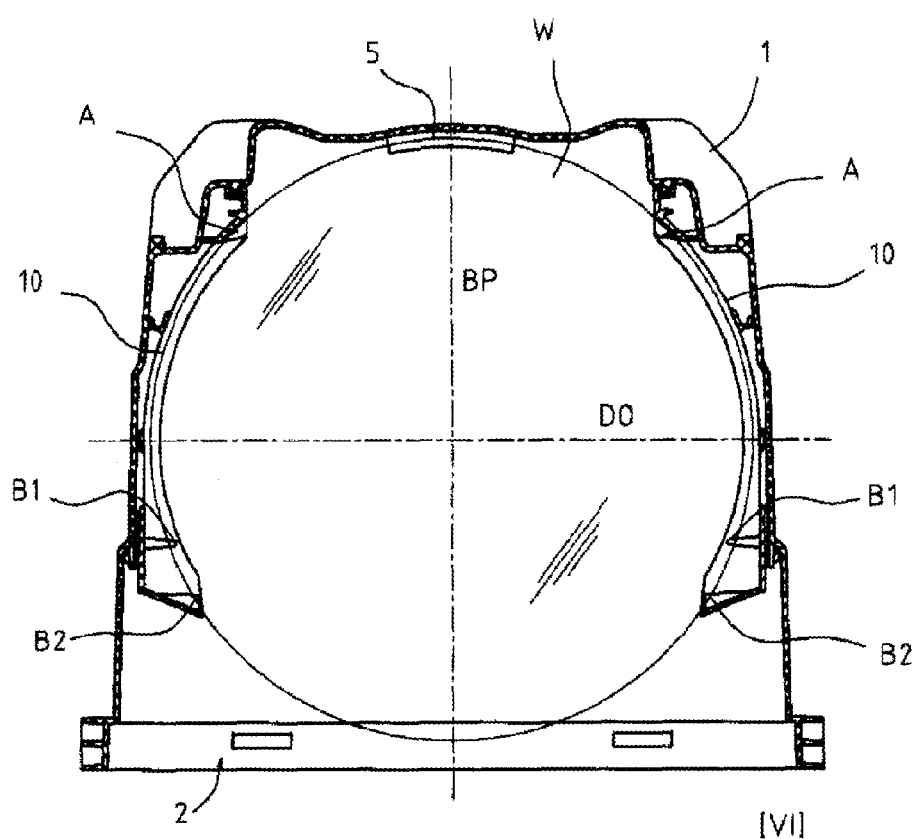
FIG. 6 is a plane cross-sectional view of a wafer storing container according to a second embodiment of the present invention, in a state where a cover is not attached thereto.
Figure 7:
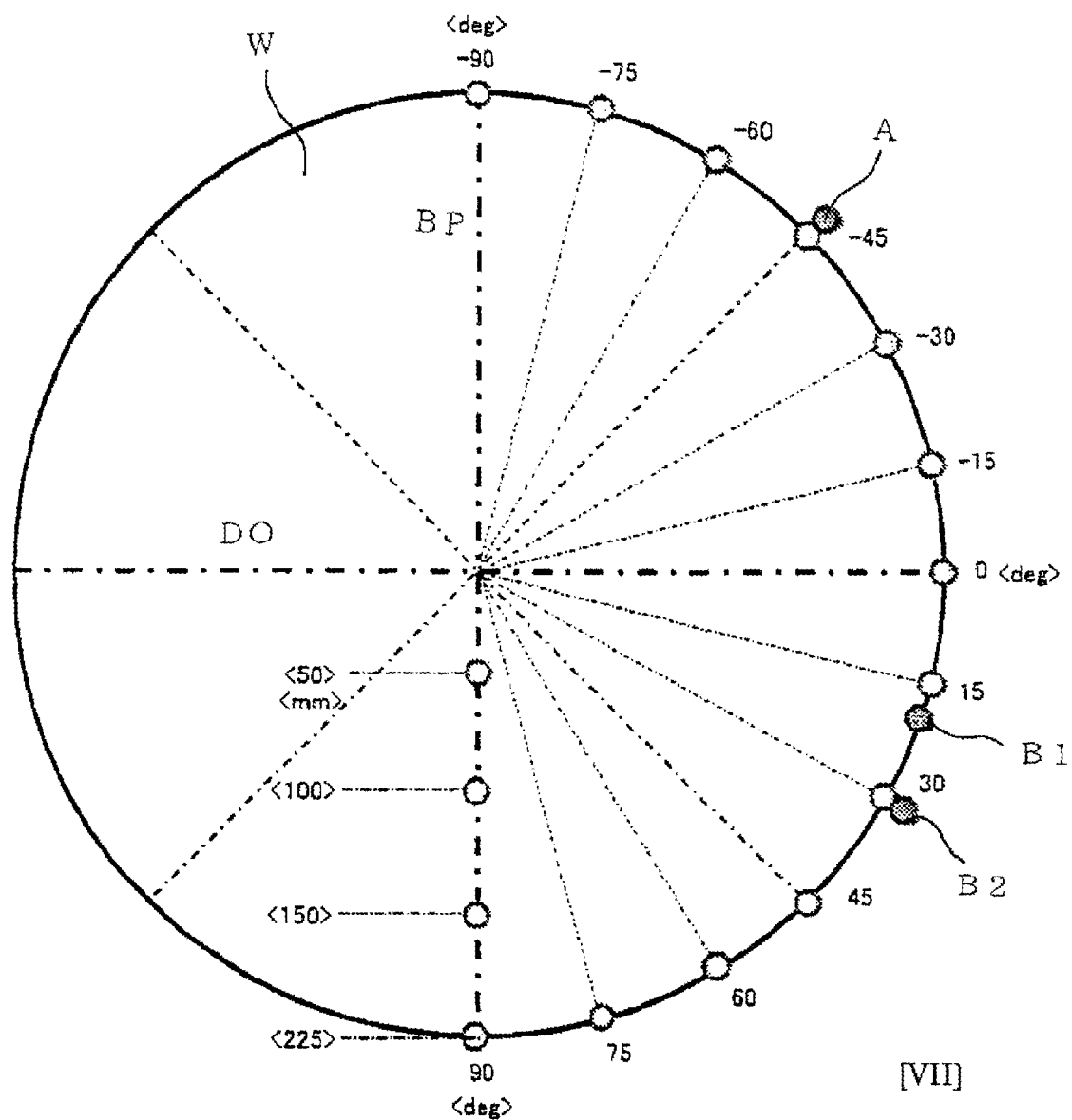
FIG. 7 is a schematic diagram showing points for mounting the semiconductor wafer, and points for measuring the amount of deflection thereof, in a state where the cover is not attached to the wafer storing container according to the second embodiment of the present invention, and where the semiconductor wafer is mounted on the wafer support shelves.
Figure 8:
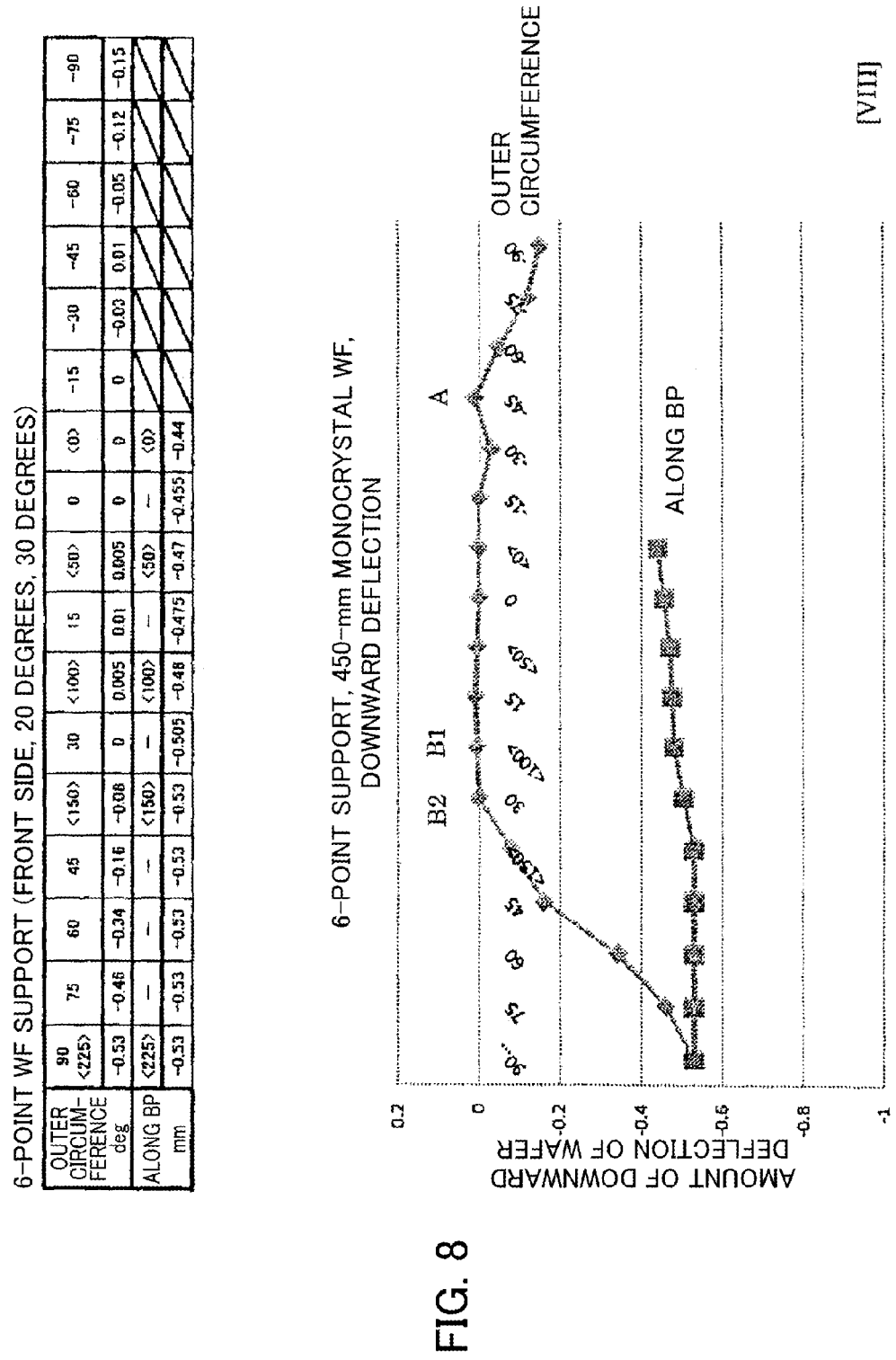
FIG. 8 shows a table and graph for illustrating measurement data (measured values) of the amount of deflection at each position of the semiconductor wafer, when the cover is not attached to the wafer storing container according to the second embodiment of the present invention, and when the semiconductor wafer is mounted on the wafer support shelves.
Figure 9:
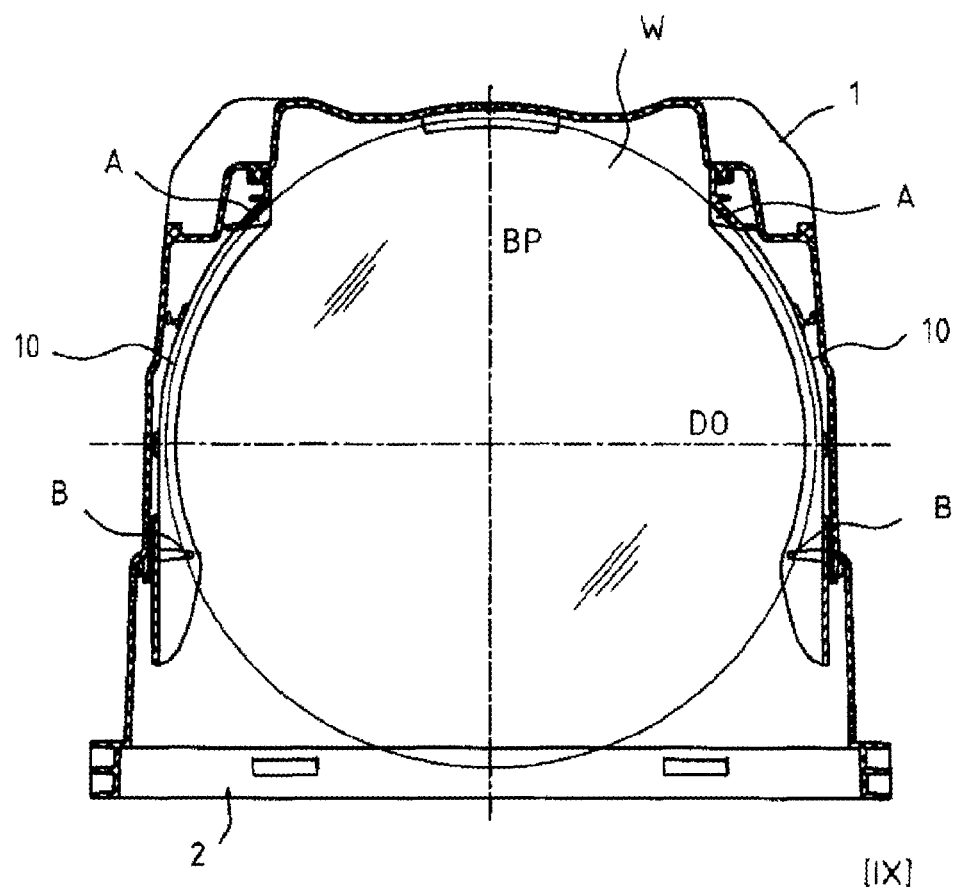
FIG. 9 is a plane cross-sectional view of a conventional wafer storing container, in a state where a cover is not attached thereto.
Figure 10:
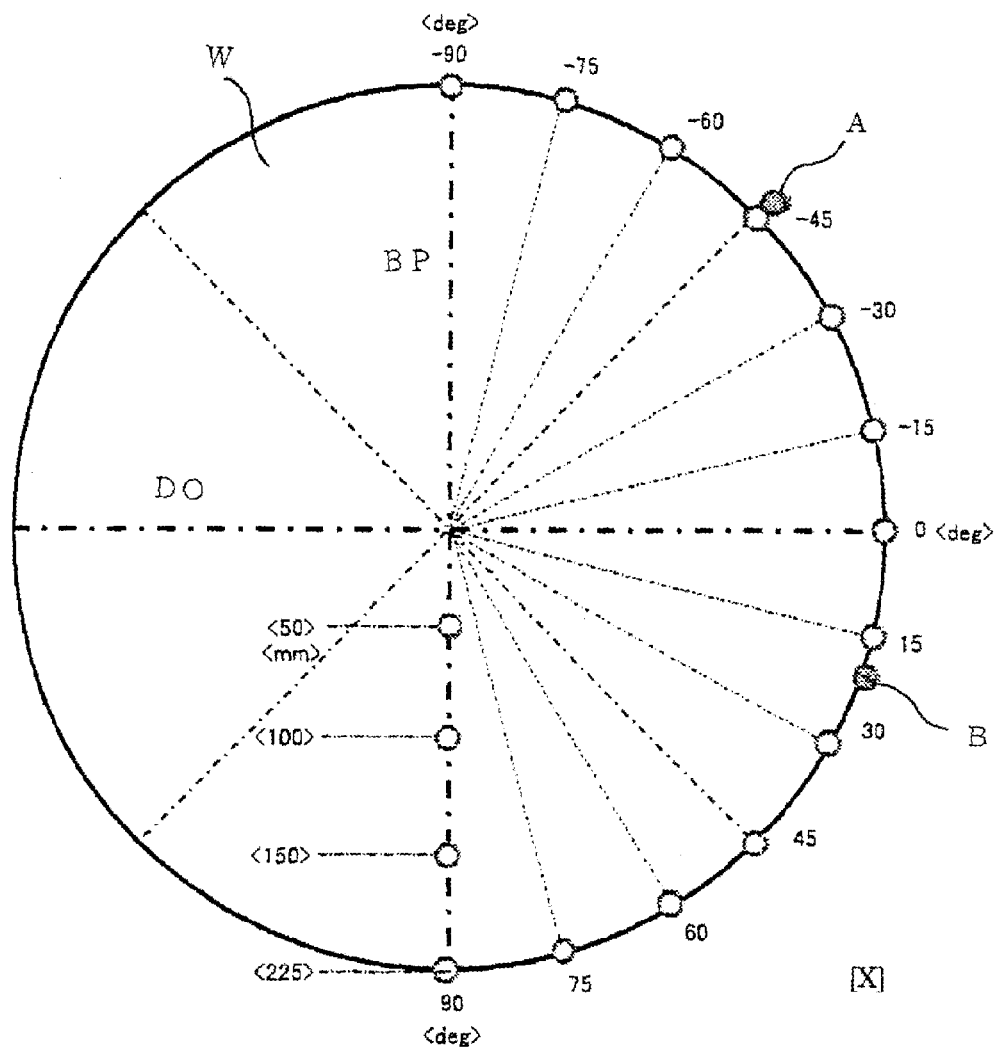
FIG. 10 is a schematic diagram showing points for mounting a semiconductor wafer, and points for measuring the amount of deflection thereof, in a state where the semiconductor wafer is supported in the conventional wafer storing container.

FIG. 6 is a plane cross-sectional view of a wafer storing container according to a second embodiment of the present invention. As schematically shown in FIG. 7, second front-side wafer support projections B2 are each provided in a direction at an angle of 30 degrees relative to the reference center line DO. Aspects other than this aspect are similar to those in the first embodiment. Even with this configuration, as shown in FIG. 8, in the state where the cover 3 is not attached to the wafer load/unload opening 2, the amount of deflection of the semiconductor wafers W can be reduced as compared with the conventional case, although not as drastically as the first embodiment.

The second front-side wafer support projections B2 can also be each provided in a direction at an angle larger than the angle in the first embodiment, on the basis of the reference center line DO. However, the distance from the sidewall of the container body 1 to this position is gradually increased (i.e. the depth of the wafer support shelf 10 is increased); therefore, the positional accuracy of the second front-side wafer support projections B2 is deteriorated in manufacturing, and it becomes difficult to secure the width of the space for inserting a robot arm. The angle limit is approximately 60 degrees at maximum.

In this manner, it is desirable for the first and second front-side wafer support projections B1, B2 to have a relative positional relationship with each other at different angles within the range of 10 to 30 degrees around the central position of the semiconductor wafer W.

In the state where the semiconductor wafers W are supported by the wafer support shelves 10, 10, it is desirable for the semiconductor wafers W to be in a state of concurrently being in contact with, and being mounted on, the first and second front-side wafer support projections B1, B2. To this end, the second front-side wafer support projections B2 should be provided in a position lower than the position of the first front-side wafer support projections B1, within the range of 0.2 mm in the height direction.

A preferable balance for retaining the semiconductor wafers W may be achieved in many cases when the back-side wafer support projections A provided at one point in each of the right and left sides are provided at a position lower than any of the front-side wafer support projections B1, B2 provided at two points in each of the right and left sides (i.e. the back side is slightly lower).

The present invention is not limited to the embodiments. For example, the diameter of the semiconductor wafers W stored in the container body 1 may be other than 450 mm.

The invention claimed is:

1. A wafer storing container, comprising:
a container body for storing a plurality of semiconductor wafers in a state of being arranged in a parallel manner;
a wafer load/unload opening that is formed in a front face of the container body for the purpose of loading or unloading the semiconductor wafer to or from the container body;
a cover removably attached from a front of the wafer load/unload opening for the purpose of closing the wafer load/unload opening; and
wafer support shelves for individually mounting outer margins of the plurality of semiconductor wafers so as to horizontally support the semiconductor wafers at positions on right and left sides inside the container body as viewed from the wafer load/unload opening, in a state where the cover is not attached to the wafer load/unload opening,
wherein the outer margins of the plurality of semiconductor wafers are partially mounted on wafer support projections of the wafer support shelves arranged on the right and left sides as viewed from the wafer load/unload opening,
wherein the wafer support projections are provided at one point on a back side and at two points on a front side in each of the right and left sides, on the basis of a central position of the semiconductor wafers as viewed from the wafer load/unload opening
wherein, among the front-side wafer support projections provided at two points in each of the right and left sides, second front-side wafer support projections farther from a reference center line are each provided in a direction at an angle within a range of 45±15 degrees relative to the reference center line, which passes through the central position of the semiconductor wafers, and is parallel to the wafer load/unload opening,
wherein, among the front-side wafer support projections provided at two points in each of the right and left sides on the front side on the basis of the central position of the semiconductor wafers, first front-side wafer support projections closer to the reference center line are each provided in a direction at an angle within a range of 20±5 degrees relative to the reference center line, and
wherein the first and second front-side wafer support projections have a relative positional relationship with each other at different angles within a range of 10 to 30 degrees around the central position of the semiconductor wafers.

2. The wafer storing container according to claim 1, wherein, in a state where the semiconductor wafers are supported by the wafer support shelves, the semiconductor wafers are in a state of concurrently being in contact with and being mounted on the first and second front-side wafer support projections.

3. The wafer storing container according to claim 2, wherein the second front-side wafer support projections are provided in a position lower than a position of the first front-side wafer support projections, within a range of 0.2 mm.

4. The wafer storing container according to claim 1, wherein the back-side wafer support projections provided at one point in each of the right and left sides are provided at a position lower than any of the front-side wafer support
projections provided at two points in each of the right and left sides.

* * * * *